United States Patent
Shen

(10) Patent No.: US 10,581,030 B2
(45) Date of Patent: Mar. 3, 2020

(54) MANUFACTURING METHOD FOR OLED PANEL AND OLED MANUFACTURING APPARATUS

(71) Applicant: Wuhan China Star Optoelectronics Semiconductor Display Technology Co., Ltd., Wuhan (CN)

(72) Inventor: Haiyang Shen, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 16/111,218

(22) Filed: Aug. 24, 2018

(65) Prior Publication Data
US 2019/0305257 A1 Oct. 3, 2019

Related U.S. Application Data

(63) Continuation of application No. PCT/CN2018/087739, filed on May 22, 2018.

(30) Foreign Application Priority Data

Mar. 30, 2018 (CN) .......................... 2018 1 0294543

(51) Int. Cl.
*H01L 51/56* (2006.01)
*B41F 5/02* (2006.01)
*H01L 27/32* (2006.01)
*H01L 51/00* (2006.01)

(52) U.S. Cl.
CPC ............... *H01L 51/56* (2013.01); *B41F 5/02* (2013.01); *H01L 27/3211* (2013.01); *H01L 51/0004* (2013.01)

(58) Field of Classification Search
None
See application file for complete search history.

(56) References Cited

U.S. PATENT DOCUMENTS

| 2004/0124781 | A1  | 7/2004  | Sung et al. |
| 2012/0058702 | A1  | 3/2012  | Yuko et al. |
| 2014/0021458 | A1* | 1/2014  | Tada ................... H01L 27/3246 257/40 |
| 2014/0356994 | A1* | 12/2014 | Shim ................. H01L 21/02343 438/29 |
| 2017/0098766 | A1  | 4/2017  | Kwon |

FOREIGN PATENT DOCUMENTS

| CN | 102195008 A | 9/2011 |
| CN | 204194217 U | 3/2015 |

* cited by examiner

Primary Examiner — Michelle Mandala

(57) ABSTRACT

The present disclosure provides a manufacturing method for an OLED panel and an OLED panel manufacturing apparatus. The OLED panel manufacturing apparatus include at least one roller; at least one outlet used to print a plurality of RGB trichromatic sub-pixels disposed in sequence on a substrate by spraying organic light-emitting coating; and at least one pipe used to convey the organic light-emitting coating. By simultaneously printing the RGB trichromatic sub-pixels on the substrate in a letterpress printing way, the present disclosure can maximize the utilization of the organic light-emitting coating forming sub-pixels, simplify the production process and cycle, and increase the production efficiency.

13 Claims, 3 Drawing Sheets

MANUFACTURING METHOD FOR OLED PANEL AND OLED MANUFACTURING APPARATUS

CROSS-REFERENCE TO RELATED APPLICATIONS

This is a continuation of International Application PCT/CN2018/087739, with an international filing date of May 22, 2018, which claims foreign priority of Chinese Patent Application No. 201810294543.7, filed on Mar. 30, 2018 in the State Intellectual Property Office of China, the contents of all of which are hereby incorporated by reference.

TECHNICAL FIELD

The present disclosure relates to a field of manufacturing display panels, and particularly to a manufacturing method for an OLED panel and an OLED manufacturing apparatus.

BACKGROUND

In the flat panel display technology, an organic light-emitting diode (OLED) displayer has been recognized in the industry as the third generation of display technology after the liquid crystal display (LCD), for its advantages of thinness, active light emission, fast response, wide viewing angle, rich colors, high brightness, low power consumption, and resistance to high and low temperature. An active matrix OLED is also referred to as an active matrix OLED (AMO-LED). The AMOLED may realize a large size and high resolution panel by integrating thin film transistors (TFTs) and capacitors in each pixel and being driven in a way of maintaining the voltage by the capacitor, and has become a focus of current research and a development direction of future display technologies.

In related art, the industry mostly forms sub-pixels on an OLED panel by an evaporation technique. However, the evaporation technique requires multiple complicated processes to form a qualified panel, and this technique also requires corollary equipment to manufacture screen printing plates, while the investment in corollary equipment is large, the production process is relatively complicated, the quality of the screen printing plate is difficult to control. It is further required in the evaporation technique to clean the panel, thus also requiring a specialized cleaning machine, and the cleaning process is also quite complicated. The problems of a complex multi-step process, a screen printing plate quality difficult to control, and a complicated cleaning, result in a low production yield of a production obtained through forming sub-pixels on the substrate by the evaporation technique, as well as a low utilization of organic light-emitting coatings for forming sub-pixels, a long production cycle and a production efficiency which cannot be improved, thus greatly affecting a large-scale production of OLED panels.

SUMMARY

A main technical problem solved by the present disclosure is to provide an OLED panel, a manufacturing method thereof and an OLED display apparatus, to improve utilization of the organic light-emitting coating forming the sub-pixels, simplify the production process and cycle, and increase the production efficiency.

In order to solve the above-mentioned technical problem, one technical solution in the present disclosure is to provide a manufacturing method of an OLED panel, including: preparing a substrate; providing a roller with a plurality of RGB liquid outlets, the RGB liquid outlets capable of spraying RGB organic light-emitting coating liquid, wherein the substrate is in contact with the roller; and rotating the roller relative to the substrate such that the organic light-emitting coating is sprayed onto the substrate to form a plurality of RGB trichromatic sub-pixels disposed in sequence on the substrate.

In order to solve the above-mentioned technical problem, a further technical solution in the present disclosure is to provide an OLED panel manufacturing apparatus, including a roller, at least one roller; at least one outlet used to print a plurality of RGB trichromatic sub-pixels disposed in sequence on a substrate by spraying organic light-emitting coating; wherein each of the outlet have a plurality of RGB liquid outlets, which are deposed on the outer wall of the roller; and at least one pipe used to convey the organic light-emitting coating; wherein each of the pipes is connecting to the RGB liquid outlet spraying organic light-emitting coating with the same color.

The beneficial effect of the present disclosure lies in that, differing from the related art, the present disclosure provides an organic light-emitting diode (OLED) display panel, with sub-pixels on the substrate printed and formed by the roller rotating to follow the movement of the substrate. The surface of the roller is provided with liquid outlets disposed in an arrangement the same with the arrangement of the sub-pixels on the substrate in at least one cycle. The liquid outlet is configured to form sub-pixels, and the RGB trichromatic sub-pixels can be printed and formed at one step. The present disclosure can improve the utilization of the organic light-emitting coating forming the sub-pixels, simplify the production process and cycle, and increase the production efficiency.

DETAILED DESCRIPTION

The technical solution in the embodiments of the present disclosure will be clearly and completely described below with reference to the accompanying drawings in the embodiments of the present disclosure. Obviously, the described embodiments are only a part of the embodiments of the present disclosure, not all of the embodiments. All other embodiments obtained by one with ordinary skills in the art based on the embodiments of the present disclosure without any creative efforts shall fall into the protection scope of the present disclosure.

It should be noted that, all the OLEDs in the present disclosure are abbreviated from organic light-emitting diodes. For the convenience of description, the organic light-emitting diodes OLED display panels in this disclosure are all abbreviated to OLED display panels.

Figure 1:
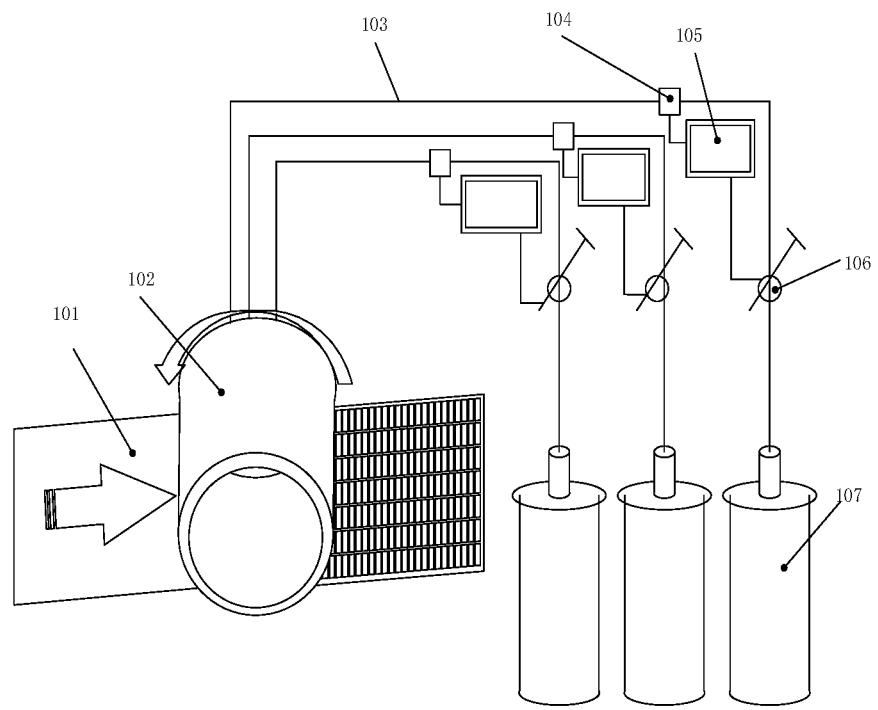
FIG. 1 is a schematic structural diagram of an OLED display panel in an embodiment of the present disclosure.

Referring to FIG. 1, FIG. 1 is a schematic structural diagram of an OLED display panel in an embodiment of the present disclosure.

The OLED display panel of this embodiment may include a substrate 101. The substrate 101 may be configured to manufacture an OLED panel. A plurality of RGB trichromatic sub-pixels (not shown) may be disposed in sequence on the substrate 101.

In this embodiment, the substrate 101 may be a glass substrate or a plastic film substrate or other substrates that can be configured to form a plurality of RGB trichromatic sub-pixels disposed in sequence, which is not limited herein.

In the present embodiment, the RGB trichromatic sub-pixels on the substrate 101 may be formed in a way of letterpress printing that the substrate 101 may be disposed under the roller 102, and as the substrate 101 moving, the roller 102 may rotate along a moving direction of the substrate 101. The roller 102 may be fixed at a certain position and rotate along an axis of the roller 102, with two opposite sides of the substrate 101 aligned with the two lateral surfaces of the roller 102 separately. The substrate 101 may move in a direction perpendicular to the other two sides, and keep the substrate 101 at least partially contacting with the roller 102. In other manners, when forming the sub-pixels on the substrate 101, the RGB trichromatic sub-pixels may also be formed in a way that the substrate 102 may be fixed under the roller 102 steadily, and the roller 102 may roll on the substrate 101 in a direction substantially perpendicular to a side of the substrate 101.

In the present embodiment, a plurality of RGB trichromatic sub-pixels disposed in sequence on the substrate 101 may be formed through an organic light-emitting coating. In order to spray a liquid organic light-emitting coating onto the substrate 101 to form the RGB trichromatic sub-pixels, three kinds of RGB organic light-emitting coating liquid outlets (not labeled) may be disposed on the roller 102. The liquid outlets may protrude from a plane of the roller 102. When the roller 102 rotates, the liquid outlet may contact with the substrate 101, and the organic light-emitting coating may be sprayed onto the substrate 101 to form a plurality of RGB trichromatic sub-pixels disposed in sequence. In order to form a predetermined sub-pixel arrangement manner on the substrate 101, the arrangement manner of the RGB liquid outlets on the roller 102 may be the same as the arrangement manner of the RGB trichromatic sub-pixels on the substrate in at least one cycle.

In this embodiment, when the liquid outlet sprays the organic light-emitting coating onto the substrate 101 to form sub-pixels, in order to enable the organic light-emitting coating to be accurately spayed onto a position of a predetermined sub-pixel, an alignment device (unlabeled) is also needed. The alignment device may be configured to control the liquid outlet on the roller 102 to correspond to a position of the sub-pixel to be formed on the substrate 101 by the liquid outlet, so that the organic light-emitting coating may be positioned on the position of a predetermined sub-pixel to form the predetermined sub-pixel, when the liquid outlet sprays the organic light-emitting coating. Herein, the alignment device may be a high-precision alignment system such as a charge-coupled device (CCD) alignment system, an alignment platform, etc., as long as the alignment device can realize the control of the organic light-emitting coating sprayed through the liquid outlet to fall into the position of the corresponding predetermined sub-pixel on the substrate 101, which is not limited herein.

In order to control the size of the RGB trichromatic sub-pixels on the substrate 101, the size of the RGB liquid outlets on the roller 102 may be adjusted according to the predetermined pixel size of the corresponding RGB trichromatic sub-pixels on the substrate 101.

In addition, in order to further adjust the size of the sub-pixel to be formed, in this embodiment, in a way of controlling a liquid outlet flow through the cooperation of a flow meter and a pressure-limiting valve, the present disclosure realizes the adjustment of the size of sub-pixel formed on the substrate 101. Besides, due to the different solid contents and materials used in the organic light-emitting coating, viscosities of the organic light-emitting coating formed may be also different. Under the same flow, the sub-pixels formed by the organic light-emitting coatings with different viscosities may be also in different sizes. Therefore, it is required to obtain a viscosity change curve corresponding to the organic light-emitting coating sprayed by the liquid outlet in different colors, before controlling the flow of the liquid outlets.

Taking controlling of the liquid outlet of the red organic light-emitting coating as an example, the way of controlling the flow of the liquid outlet will be described. In order to control the flow of the liquid outlet, as shown in FIG. 1, a flow meter 104, a controller 105, a pressure limiter 106, and a red organic light-emitting coating storage apparatus 107 may also be provided on a pipe 103 for conveying the organic light-emitting coating configured to form red sub-pixels.

One end of the pipe 103 may be connected with the red organic light-emitting coating storage apparatus 107, and the other end may be connected with a liquid outlet of red organic light-emitting coating on the roller 102. The pipe 103 may convey the red organic light-emitting coating stored in the red organic light-emitting coating storage apparatus 107 to the liquid outlet of red organic light-emitting coating on the roller 102. The roller 102 may be provided with a valve (not labeled). When the red liquid outlet on the roller 102 contacts with the substrate 101, the valve may control the pipe 103 to connect with or communicate with the liquid outlet, and the liquid outlet may spray red organic light-emitting coating.

When the liquid outlet sprays the organic light-emitting coating, the flow meter 104 may control the spray amount of the organic light-emitting coating at the liquid outlet, and the flow meter 104 may detect the flow of the red organic light-emitting coating in the pipe 103 and transmit the data to the controller 105. Herein, the flow meter 104 may be any one of an anti-corrosion flow meter, a differential pressure flow meter, an ammonia flow meter, a turbine flow meter, an electromagnetic flow meter, and a fluid oscillation flow meter such as a vortex flow meter in, a mass flow meter, and an SST plug-in flow meter, that can measure the flow of the organic light-emitting coating in the pipe 103, which is not limited herein.

The controller 105 may obtain the flow data delivered by the flow meter, and determine whether to control the spray amount of the liquid outlet according to the size of the red sub-pixel corresponding to the liquid outlet connected to the pipe 103 and the viscosity change curve corresponding to the delivered organic light-emitting coating. If so, the controller 105 may send a command of controlling the red organic light-emitting coating in the pipe 103 to a pressure-limiting valve 106. The pressure-limiting valve 106 may receive the command and adjust the pressure in the pipe 103 according to the command, to control the flow of the red organic light-emitting coating in the liquid outlet.

In the above embodiment, the flow meter 104, the controller 105, and the pressure-limiting valve 106 may be disposed in the same equipment, or may be separated into several different equipment, and the functions of all three may be combined or split according to requirements, as long as it can be realized to detect the flow of the organic light-emitting coating in the pipe 103, and to change the pressure in the pipe 103 according to the flow and the predetermined viscosity change curve, so as to change the spray amount of the organic light-emitting coating at the liquid outlet, i.e., the flow of the liquid outlet, which is not repeated herein.

Further, in order to prevent the pipe 103 from being affected by the rotation of the roller 102. The present disclosure further provides a rotary shaft (not shown) on the roller 102, with two ends of the rotary shaft separately connected to the pipe 103 and the roller 102. Herein, one end connected to the pipe 103 may be fixed, and the other end may be rotatable with the roller 102. The rotating shaft may be configured to prevent the pipe 103 from being affected when the roller 102 rotates to leak the organic light-emitting coating in the pipe 103. In other embodiments, component coupled the pipe 103 and the roller 102 can also be component that can prevent the pipe 103 from being affected by the rotation of the roller 102 and prevent the organic light-emitting coating from leaking, which is not limited herein.

In the above embodiment, in addition to the pipe 103 for conveying the red organic light-emitting coating, there are also pipes (unlabeled) for conveying convey the green and blue organic light-emitting coatings and organic light-emitting coating storage apparatus (not shown), with corresponding flow meters (not shown), controllers (not labeled), and pressure-limiting valves (not labeled) on those two pipes. The functions of these apparatus and the effects achieved are the same as those described above, and will not be described repeatedly herein.

In other embodiments, the organic light-emitting coating may also be in four colors of RGBW. Therefore, the sub-pixels formed on the substrate 101 may be in four colors of RGBW, and the liquid outlets on the roller 102 may be arranged corresponding to the arrangements of sub-pixels on the substrate 101, and will not be described in detail herein.

Further, with the roller 102 provided with a plurality of liquid outlets for spraying red organic light-emitting coating, these liquid outlets may be connected with the pipe 103. For better conveying the organic light-emitting coating in the pipe to the liquid outlet, and in order that the liquid outlet may spray the organic light-emitting coating only when the liquid outlet contacts with the substrate 101, in the present disclosure, after the pipe 103 conveys the organic light-emitting coating onto the roller 102 through the rotating shaft, a plurality of secondary pipes (not shown) connecting the liquid outlet and the pipe 103 may also be provided on the roller 102.

The beneficial effect of the present disclosure lies in that, differing from the prior art, the present disclosure provides an organic light-emitting diode (OLED) display panel, with sub-pixels on the substrate printed and formed by the roller rotating to follow the movement of the substrate. The surface of the roller may be provided with liquid outlets disposed in an arrangement the same with the arrangement of the sub-pixels on the substrate in at least one cycle. The liquid outlet may be configured to form sub-pixels, and the RGB trichromatic sub-pixels can be printed and formed at one step. The present disclosure can improve the utilization of the organic light-emitting coating forming the sub-pixels, simplify the production process and cycle, and increase the production efficiency.

Figure 2:
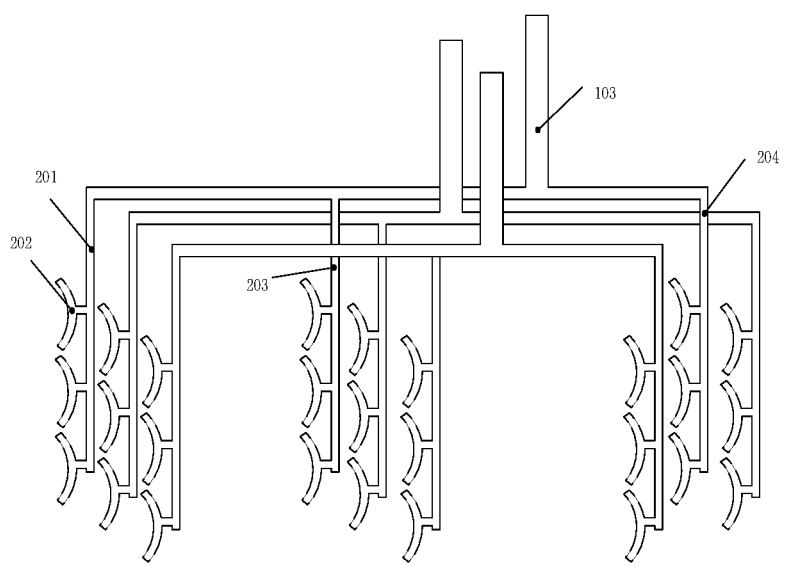
FIG. 2 is a schematic structural diagram of a secondary pipe coupled to a liquid outlet on a roller of FIG. 1 in an embodiment of the present disclosure.

For a further description of the secondary pipe in the roller mentioned in the above embodiment, referring to FIG. 2, FIG. 2 is a schematic structural diagram of an embodiment of a secondary pipe connecting the liquid outlets of the roller of FIG. 1.

In the present embodiment, a description will be made, by taking the secondary pipe 201 for spraying the red organic light-emitting coating as an example.

A distal end of one end of the secondary pipe 201 may be an arc structure 202. The distal end of the arc structure may be connected with the liquid outlet on the roller. In order to make the liquid outlets spraying red organic light-emitting coating simultaneously contacting the substrate on the roller to be capable of spraying the organic light-emitting coating at the same time, the secondary pipe 201 may have a connecting line running through the arc-shaped structure of the liquid outlet, which is perpendicular to a cross-section of the roller, and in such a connecting way, the liquid outlets connected to the secondary pipe 201 may obtain and spray the organic light-emitting coating at the same time.

The other end of the secondary pipe 201 may be connected to the secondary pipe 203 and the secondary pipe 204 that also convey the red organic light-emitting coating, and may be connected to the pipe 103 in common. The connection and arrangement of the secondary pipe 203 and the secondary pipe 204 to the liquid outlet are the same, and will not be repeated herein.

In order to control the red organic light-emitting coating to be sprayed only by the liquid outlet which contacts with the substrate, a valve (not shown) for controlling the conduction of the secondary pipe may be also provided on the secondary pipe, and the valve may control the communicating of the secondary pipe when the liquid outlet contacts the substrate, so that the liquid outlet can communicate with the pipe 103 and spray the organic light-emitting coating.

In the above embodiment, in addition to the secondary pipe 201, the secondary pipe 203, and the secondary pipe 204 for conveying the red organic light-emitting coating, there are also secondary pipes (unlabeled) for conveying the green and blue organic light-emitting coatings. Herein, these secondary pipes and the secondary pipe 201, the secondary pipe 203, and the secondary pipe 204 conveying the red organic light-emitting coating may be arranged in the same manner, and will not be described repeatedly herein.

In other embodiments, the organic light-emitting coating may also be in four colors of RGBW. Therefore, the sub-pixels formed on the substrate are in four colors of RGBW, and the arrangement and connection of secondary pipes on the roller are also correspondingly provided, which will not be described in detail herein.

Based on the same inventive concept, the present disclosure also provides an OLED display apparatus including the OLED display panel as described above.

In this embodiment, the OLED display apparatus may be a smart terminal such as a computer, a mobile phone, or a wearable device, or may also be a display apparatus such as a car meter, a self-service terminal, a television, a billboard, etc., as long as the display apparatus may have the above-mentioned display apparatus of the OLED display panel, and is not limited herein.

Figure 3:
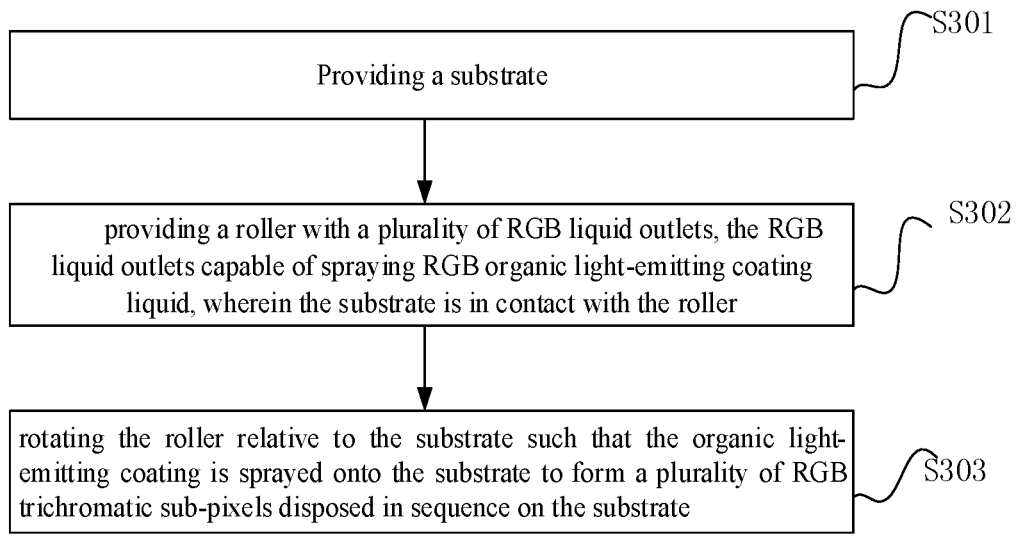
FIG. 3 is a schematic flowchart of a manufacturing method of an OLED panel in an embodiment of the present disclosure.

Referring to FIG. 3, FIG. 3 is a schematic flowchart of an embodiment of a manufacturing method of an OLED panel of the present disclosure.

In S301, the method may include providing a substrate.

In this embodiment, the substrate may be a glass substrate, or a plastic film substrate, or other substrates that may be configured to manufacture an OLED panel and may form a plurality of RGB trichromatic sub-pixels disposed in sequence, which is not limited herein.

In S302, the method may include providing a roller with a plurality of RGB liquid outlets, the RGB liquid outlets capable of spraying RGB organic light-emitting coating liquid, wherein the substrate is in contact with the roller.

In S303, the method may include rotating the roller relative to the substrate such that the organic light-emitting coating is sprayed onto the substrate to form a plurality of RGB trichromatic sub-pixels disposed in sequence on the substrate.

In a specific implementation scenario, the substrate may be disposed under the roller, with two opposite sides of the substrate aligned with the two lateral sides of the roller, separately. The substrate may move in a direction perpendicular to the other two sides and maintains the substrate partially contacting with the roller. The roller follows the substrate to perform a rotational movement, with a rotation direction of the roller being the moving direction of the substrate. A plurality of RGB liquid outlets may be provided on the roller, and these liquid outlets may be disposed in an arrangement manner the same with the arrangement of the RGB trichromatic sub-pixels on the substrate in at least one cycle. When the roller rotates to follow the substrate, the liquid outlet on the roller contacting to the substrate may spray the organic light-emitting coating to the position of corresponding sub-pixels on the substrate, thereby forming a plurality of RGB trichromatic sub-pixels disposed in sequence.

In the present embodiment, the RGB trichromatic sub-pixels on the substrate are formed in a way of letterpress printing that the substrate is disposed under the roller 102, and as the substrate moves, the roller rotates along a moving direction of the substrate. The roller may be fixed at a certain position and rotate along an axis of the roller. In other embodiments, when the sub-pixels on the substrate are formed, the RGB trichromatic sub-pixels may also be formed in a way that the substrate may be fixed under the roller steadily, and the roller may roll on the substrate in a direction along an extending direction of the substrate.

In this embodiment, when the liquid outlet sprays the organic light-emitting coating onto the substrate to form sub-pixels, in order to enable the organic light-emitting coating to be accurately spayed onto a position of a predetermined sub-pixel, an alignment device (unlabeled) may also be needed. The alignment device may be configured to control the liquid outlet on the roller to correspond to a position of the sub-pixel to be formed on the substrate by the liquid outlet, so that the organic light-emitting coating may be positioned on the position of a predetermined sub-pixel to form the predetermined sub-pixel, when the liquid outlet sprays the organic light-emitting coating. Herein, the alignment device may be a high-precision alignment system such as a CCD alignment system, an alignment platform, etc., as long as the alignment device can realize the control of the organic light-emitting coating sprayed through the liquid outlet to fall into the position of the corresponding predetermined sub-pixel on the substrate 101, which is not limited herein.

In order to control the size of the RGB trichromatic sub-pixels on the substrate, the size of the RGB liquid outlets on the roller is adjusted according to the predetermined pixel size of the corresponding RGB trichromatic sub-pixels on the substrate.

In addition, in order to further adjust the size of the sub-pixel to be formed, in this embodiment, in a way of controlling a liquid outlet flow through the cooperation of a flow meter and a pressure-limiting valve, the present disclosure realizes the adjustment of the size of sub-pixel formed on the substrate. Besides, due to the different solid contents and materials used in the organic light-emitting coating, viscosities of the organic light-emitting coating formed are also different. Under the same flow, the sub-pixels formed by the organic light-emitting coatings with different viscosities are also in different sizes. Therefore, it is required to obtain a viscosity change curve corresponding to the organic light-emitting coating sprayed by the liquid outlet in different colors, before controlling the flow of the liquid outlets, and the viscosity change curve is a time-dependence changing curve of the organic light-emitting coating.

Taking controlling of the liquid outlet of the red organic light-emitting coating as an example, the way of controlling the flow of the liquid outlet will be described. In order to control the flow of the liquid outlet, a flow meter, a controller, a pressure limiter, and a red organic light-emitting coating storage apparatus are also provided on a pipe for conveying the organic light-emitting coating configured to form red sub-pixels.

One end of the pipe is connected with the red organic light-emitting coating storage apparatus, and the other end is connected with a liquid outlet of red organic light-emitting coating on the roller. The pipe conveys the red organic light-emitting coating stored in the red organic light-emitting coating storage apparatus to the liquid outlet of red organic light-emitting coating on the roller. The roller is provided with a valve (not labeled). When the red liquid outlet on the roller contacts with the substrate, the valve controls the pipe to connect with or communicate with the liquid outlet, and the liquid outlet sprays red organic light-emitting coating.

When the liquid outlet sprays the organic light-emitting coating, the flow meter may control the spray amount of the organic light-emitting coating at the liquid outlet, and the flow meter may detect the flow of the red organic light-emitting coating in the pipe and transmits the data to the controller. Herein, the flow meter may be any one of an anti-corrosion flow meter, a differential pressure flow meter, an ammonia flow meter, a turbine flow meter, an electromagnetic flow meter, and a fluid oscillation flow meter such as a vortex flow meter, a mass flow meter, and an SST plug-in flow meter, that can measure the flow of the organic light-emitting coating in the pipe, which is not limited herein.

The controller may obtain the flow data delivered by the flow meter, and determine whether to control the spray amount of the liquid outlet according to the size of the red sub-pixel corresponding to the liquid outlet connected to the pipe and the viscosity change curve corresponding to the delivered organic light-emitting coating. If so, the controller sends a command to control the red organic light-emitting coating in the pipe 103 to a pressure-limiting valve. The pressure-limiting valve may receive the command and adjusts the pressure in the pipe according to the command, to control the flow of the red organic light-emitting coating in the liquid outlet.

In the above embodiment, the flow meter, the controller, and the pressure-limiting valve may be disposed in the same equipment, or may be separated into several different equipment, and the functions of all three may be combined or split according to requirements, as long as it can be realized to detect the flow of the organic light-emitting coating in the pipe, and to change the pressure in the pipe according to the flow and the predetermined viscosity change curve, so as to change the spray amount of the organic light-emitting coating at the liquid outlet, i.e., the flow of the liquid outlet, which is not repeated herein.

Further, in order to prevent the pipe from being affected by the rotation of the roller. The present disclosure may further provide a rotary shaft (not shown) on the roller, with both ends of the rotary shaft separately connected to the pipe and the roller. Herein, one end connected to the pipe may be fixed, and the other end may be rotatable with the roller. The rotating shaft may be configured to prevent the pipe from being affected when the roller rotates to leak the organic light-emitting coating in the pipe. In other embodiments, other component that can prevent the pipe from being affected by the rotation of the roller and prevent the organic light-emitting coating from leaking, may also connect the pipe and the roller, which is not limited herein.

In the above embodiment, in addition to the pipe for conveying the red organic light-emitting coating, there are also pipes (unlabeled) for conveying convey the green and blue organic light-emitting coatings and organic light-emitting coating storage apparatus (not shown), with corresponding flow meters (not shown), controllers (not labeled), and pressure-limiting valves (not labeled) on those two pipes. The functions of these apparatus and the effects achieved are the same as those described above, and will not be described repeatedly herein.

In other embodiments, the organic light-emitting coating may also be in four colors of RGBW. Therefore, the sub-pixels formed on the substrate 101 may be in four colors of RGBW, and the liquid outlets on the roller 102 may be arranged corresponding to the arrangements of sub-pixels on the substrate, and will not be described in detail herein.

Further, with the roller provided with a plurality of liquid outlets for spraying red organic light-emitting coating, these liquid outlets may communicate with the pipe. For better conveying the organic light-emitting coating in the pipe to the liquid outlet, and in order that the liquid outlet may spray the organic light-emitting coating only when the liquid outlet contacts with the substrate, in the present disclosure, after the pipe conveys the organic light-emitting coating onto the roller through the rotating shaft, a plurality of secondary pipes (not shown) connecting the liquid outlet and the pipe 103 may also be provided on the roller.

In the present embodiment, a description will be made, by taking the secondary pipe for spraying the red organic light-emitting coating as an example.

A distal end of one end of the secondary pipe may be an arc structure. The distal end of the arc structure may be connected with the liquid outlet on the roller. In order to make the liquid outlets spraying red organic light-emitting coating simultaneously contacting the substrate on the roller to be capable of spraying the organic light-emitting coating at the same time, the secondary pipe may have a connecting line running through the arc-shaped structure of the liquid outlet, which is perpendicular to a cross-section of the roller, and in such a connecting way, the liquid outlets connected to the secondary pipe may obtain and spray the organic light-emitting coating at the same time.

The other end of the secondary pipe may be connected to the secondary pipes that also convey the red organic light-emitting coating, and may be connected to the pipe in common. The connection and arrangement of the secondary pipes to the liquid outlet may be the same, and will not be repeated herein.

In order to control the red organic light-emitting coating to be sprayed only by the liquid outlet which contacts with the substrate, a valve for controlling the conduction of the secondary pipe is also provided on the secondary pipe, and the valve may control the communicating of the secondary pipe when the liquid outlet contacts the substrate, so that the liquid outlet can communicate with the pipe and spray the organic light-emitting coating.

In the above embodiment, in addition to the secondary pipes for conveying the red organic light-emitting coating, there are also secondary pipes for conveying the green and blue organic light-emitting coatings. Herein, these secondary pipes and the secondary pipes conveying the red organic light-emitting coating may be arranged in the same manner, and will not be described repeatedly herein.

In other embodiments, the organic light-emitting coating may also be in four colors of RGBW. Therefore, the sub-pixels formed on the substrate may be in four colors of RGBW, and the arrangement and connection of secondary pipes on the roller may also be correspondingly provided, which will not be described in detail herein.

The beneficial effect of the present disclosure lies in that, differing from the prior art, the present disclosure provides a manufacturing method of an OLED display panel, with sub-pixels on the substrate printed and formed by the roller rotating to follow the movement of the substrate. The surface of the roller may be provided with liquid outlets disposed in an arrangement the same with the arrangement of the sub-pixels on the substrate in at least one cycle. The liquid outlet may be configured to form sub-pixels, and the RGB trichromatic sub-pixels can be printed and formed at one step. This disclosure can improve the utilization of the organic light-emitting coating forming the sub-pixels, simplify the production process and cycle, and increase the production efficiency.

Figure 4:
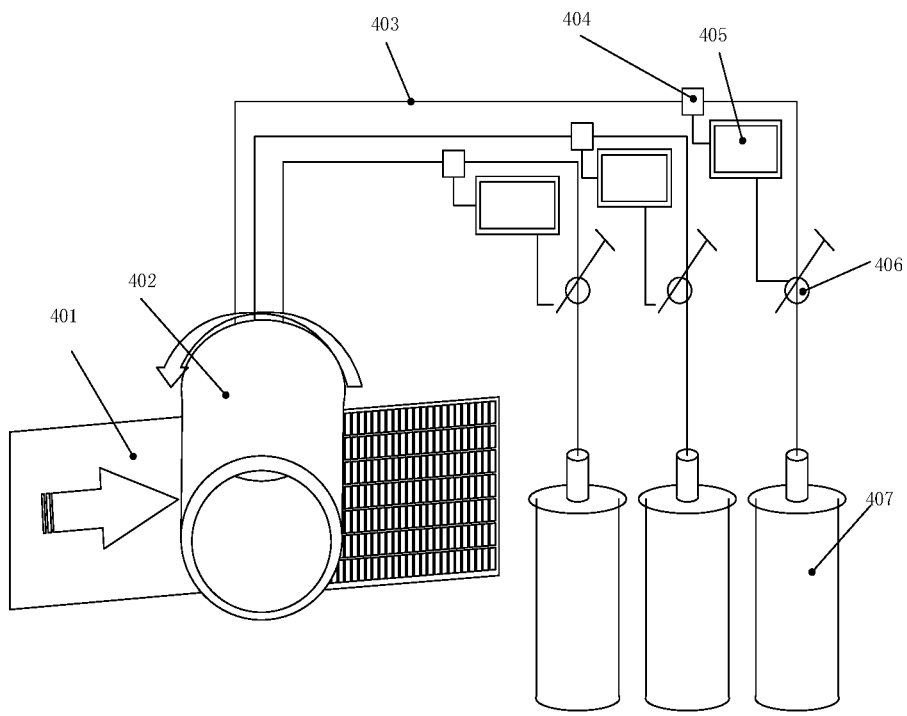
FIG. 4 is a schematic structural diagram of a manufacturing apparatus of an OLED panel according to an embodiment of the present disclosure.

Based on the same inventive concept, the present disclosure also provides an OLED panel manufacturing apparatus. Referring to FIG. 4, FIG. 4 is a schematic structural diagram of an embodiment of a manufacturing apparatus of an OLED panel of the present disclosure. The manufacturing apparatus may include a roller 402, a pipe 403, a flow meter 404, a controller 405, a pressure-limiting valve 406, and an organic light-emitting coating storage apparatus 407.

In this embodiment, the OLED panel manufacturing apparatus may be configured to spray the organic light-emitting coating on the substrate 401 in a letterpress printing manner, and form a plurality of RGB trichromatic sub-pixels (not labeled) disposed in sequence.

In this embodiment, the substrate 401 may be a glass substrate or a plastic film substrate or other substrates that can be used to form RGB trichromatic sub-pixels disposed in sequence, which is not limited herein.

In the present embodiment, the RGB trichromatic sub-pixels on the substrate 401 may be formed in a way of letterpress printing that the substrate 401 may be disposed under the roller 402, and as the substrate 401 moving, the roller 402 may rotate along a moving direction of the substrate 401. The roller 402 may be fixed at a certain position and may rotate along an axis of the roller 402, with two opposite sides of the substrate 401 aligned with the two lateral surfaces of the roller 402 separately. The substrate 401 may move in a direction perpendicular to the other two sides, and keep the substrate 401 at least partially contacting with the roller 402. In other manners, when forming the sub-pixels on the substrate 401, the RGB trichromatic sub-pixels may also be formed in a way that the substrate 402 may be fixed under the roller 402 steadily, and the roller 402 may roll on the substrate 401 in a direction perpendicular to a side of the substrate 401.

In the present embodiment, a plurality of RGB trichromatic sub-pixels disposed in sequence on the substrate 401 may be formed through an organic light-emitting coating. In order to spray a liquid organic light-emitting coating onto the substrate 401 to form the RGB trichromatic sub-pixels, three kinds of RGB organic light-emitting coating liquid outlets (not labeled) may be disposed on the roller 402. The liquid outlets protrude from a plane of the roller 402. When the roller 402 rotates, the liquid outlet may contact with the substrate 401, and the organic light-emitting coating may be sprayed onto the substrate 401 to form a plurality of RGB trichromatic sub-pixels disposed in sequence. In order to form a predetermined sub-pixel arrangement manner on the substrate 401, the arrangement manner of the RGB liquid outlets on the roller 402 may be the same as the arrangement manner of the RGB trichromatic sub-pixels on the substrate in at least one cycle.

In this embodiment, when the liquid outlet sprays the organic light-emitting coating onto the substrate 401 to form sub-pixels, in order to enable the organic light-emitting coating to be accurately spayed onto a position of a predetermined sub-pixel, an alignment device (unlabeled) is also needed. The alignment device may be configured to control the liquid outlet on the roller 402 to correspond to a position of the sub-pixel to be formed on the substrate 401 by the liquid outlet, so that the organic light-emitting coating may be positioned on the position of a predetermined sub-pixel to form the predetermined sub-pixel, when the liquid outlet sprays the organic light-emitting coating. Herein, the alignment device may be a high-precision alignment system such as a CCD alignment system, an alignment platform, etc., as long as the alignment device can realize the control of the organic light-emitting coating sprayed through the liquid outlet to fall into the position of the corresponding predetermined sub-pixel on the substrate 401, which is not limited herein.

In order to control the size of the RGB trichromatic sub-pixels on the substrate 401, the size of the RGB liquid outlets on the roller 402 is adjusted according to the predetermined pixel size of the corresponding RGB trichromatic sub-pixels on the substrate 401.

In addition, in order to further adjust the size of the sub-pixel to be formed, in this embodiment, in a way of controlling a liquid outlet flow through the cooperation of a flow meter and a pressure-limiting valve, the present disclosure realizes the adjustment of the size of sub-pixel formed on the substrate 401. Besides, due to the different solid contents and materials used in the organic light-emitting coating, viscosities of the organic light-emitting coating formed are also different. Under the same flow, the sub-pixels formed by the organic light-emitting coatings with different viscosities may also be in different sizes. Therefore, it is required to obtain a viscosity change curve corresponding to the organic light-emitting coating sprayed by the liquid outlet in different colors, before controlling the flow of the liquid outlets.

Taking controlling of the liquid outlet of the red organic light-emitting coating as an example, the way of controlling the flow of the liquid outlet will be described. In order to control the flow of the liquid outlet, as shown in FIG. 4, a flow meter 404, a controller 405, a pressure limiter 406, and a red organic light-emitting coating storage apparatus 407 may also be provided on a pipe 403 for conveying the organic light-emitting coating configured to form red sub-pixels.

One end of the pipe 403 may be connected with the red organic light-emitting coating storage apparatus 407, and the other end may be connected with a liquid outlet of red organic light-emitting coating on the roller 402. The pipe 403 may convey the red organic light-emitting coating stored in the red organic light-emitting coating storage apparatus 407 to the liquid outlet of red organic light-emitting coating on the roller 402. The roller 402 may be provided with a valve (not labeled). When the red liquid outlet on the roller 402 contacts with the substrate 401, the valve controls the pipe 403 to connect with or communicate with the liquid outlet, and the liquid outlet may sprays red organic light-emitting coating.

When the liquid outlet sprays the organic light-emitting coating, the flow meter 404 may control the spray amount of the organic light-emitting coating at the liquid outlet, and the flow meter 404 may detect the flow of the red organic light-emitting coating in the pipe 403 and transmit the data to the controller 405. Herein, the flow meter 404 may be any one of an anti-corrosion flow meter, a differential pressure flow meter, an ammonia flow meter, a turbine flow meter, an electromagnetic flow meter, and a fluid oscillation flow meter such as a vortex flow meter in, a mass flow meter, and an SST plug-in flow meter, that can measure the flow of the organic light-emitting coating in the pipe 403, which is not limited herein.

The controller 405 may obtain the flow data delivered by the flow meter, and determine whether to control the spray amount of the liquid outlet according to the size of the red sub-pixel corresponding to the liquid outlet connected to the pipe 403 and the viscosity change curve corresponding to the delivered organic light-emitting coating. If so, the controller 405 sends a command of controlling the red organic light-emitting coating in the pipe 103 to a pressure-limiting valve 406. The pressure-limiting valve 406 may receive the command and adjust the pressure in the pipe 403 according to the command, to control the flow of the red organic light-emitting coating in the liquid outlet.

In the above embodiment, the flow meter 404, the controller 405, and the pressure-limiting valve 406 may be disposed in the same equipment, or may be separated into several different equipment, and the functions of all three may be combined or split according to requirements, as long as it can be realized to detect the flow of the organic light-emitting coating in the pipe 403, and to change the pressure in the pipe 403 according to the flow and the predetermined viscosity change curve, so as to change the spray amount of the organic light-emitting coating at the liquid outlet, i.e., the flow of the liquid outlet, which is not repeated herein.

Further, in order to prevent the pipe 403 from being affected by the rotation of the roller 402. The present disclosure may further provide a rotary shaft (not shown) on the roller 402, with two ends of the rotary shaft separately connected to the pipe 403 and the roller 402. Herein, one end connected to the pipe 403 may be fixed, and the other end may be rotatable with the roller 402. The rotating shaft may be configured to prevent the pipe 403 from being affected when the roller 402 rotates to leak the organic light-emitting coating in the pipe 403. In other embodiments, other component that can prevent the pipe 403 from being affected by the rotation of the roller 402 and prevent the organic light-emitting coating from leaking may also connect the pipe 103 and the roller 402, which is not limited herein.

In the above embodiment, in addition to the pipe 403 for conveying the red organic light-emitting coating, there are also pipes (unlabeled) for conveying convey the green and blue organic light-emitting coatings and organic light-emitting coating storage apparatus (not shown), with corresponding flow meters (not shown), controllers (not labeled), and pressure-limiting valves (not labeled) on those two pipes. The functions of these apparatus and the effects achieved are the same as those described above, and will not be described repeatedly herein.

In other embodiments, the organic light-emitting coating may also be in four colors of RGBW. Therefore, the sub-pixels formed on the substrate 401 may be in four colors of RGBW, and the liquid outlets on the roller 402 are arranged corresponding to the arrangements of sub-pixels on the substrate 401, and will not be described in detail herein.

Further, with the roller 402 provided with a plurality of liquid outlets for spraying red organic light-emitting coating, these liquid outlets may be connected with the pipe 403. For better conveying the organic light-emitting coating in the pipe to the liquid outlet, and in order that the liquid outlet sprays the organic light-emitting coating only when the liquid outlet contacts with the substrate 401, in the present disclosure, after the pipe 403 conveys the organic light-emitting coating onto the roller 402 through the rotating shaft, a plurality of secondary pipes (not shown) connecting the liquid outlet and the pipe 103 may be also provided on the roller 402.

Figure 5:
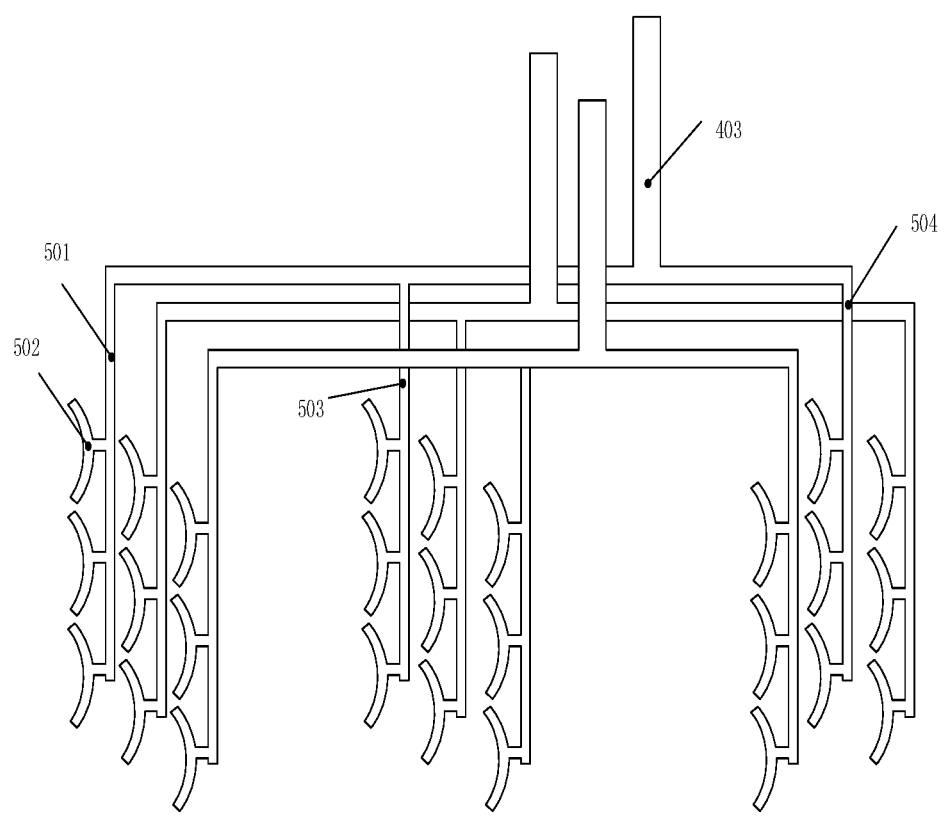
FIG. 5 is a schematic structural diagram of a secondary pipe coupled to a liquid outlet on the roller of FIG. 4 of an embodiment.

For a further description of the secondary pipe in the roller mentioned in the above embodiment, referring to FIG. 5, FIG. 5 is a schematic structural diagram of an embodiment of a secondary pipe connecting the liquid outlets of the roller of FIG. 4.

In the present embodiment, a description will be made, by taking the secondary pipe 501 for spraying the red organic light-emitting coating as an example.

A distal end of one end of the secondary pipe 501 may be an arc structure 502. The distal end of the arc structure may be connected with the liquid outlet on the roller. In order to make the liquid outlets spraying red organic light-emitting coating simultaneously contacting the substrate on the roller to be capable of spraying the organic light-emitting coating at the same time, the secondary pipe 501 may have a connecting line running through the arc-shaped structure of the liquid outlet, which is perpendicular to a cross-section of the roller, and in such a connecting way, the liquid outlets connected to the secondary pipe 501 may obtain and spray the organic light-emitting coating at the same time.

The other end of the secondary pipe 501 may be connected to the secondary pipe 503 and the secondary pipe 504 that also convey the red organic light-emitting coating, and may be connected to the pipe 403 in common. The connection and arrangement of the secondary pipe 503 and the secondary pipe 504 to the liquid outlet may be the same, and will not be repeated herein.

In order to control the red organic light-emitting coating to be sprayed only by the liquid outlet which contacts with the substrate, a valve (not shown) for controlling the conduction of the secondary pipe may also be provided on the secondary pipe, and the valve may control the communicating of the secondary pipe when the liquid outlet contacts the substrate, so that the liquid outlet can communicate with the pipe 503 and spray the organic light-emitting coating.

In the above embodiment, in addition to the secondary pipe 501, the secondary pipe 503, and the secondary pipe 504 for conveying the red organic light-emitting coating, there are also secondary pipes (unlabeled) for conveying the green and blue organic light-emitting coatings. Herein, these secondary pipes and the secondary pipe 501, the secondary pipe 503, and the secondary pipe 504 conveying the red organic light-emitting coating are arranged in the same manner, and will not be described repeatedly herein.

In other embodiments, the organic light-emitting coating may also be in four colors of RGBW. Therefore, the sub-pixels formed on the substrate may be in four colors of RGBW, and the arrangement and connection of secondary pipes on the roller are also correspondingly provided, which will not be described in detail herein.

The beneficial effect of the present disclosure lies in that, differing from the prior art, the present disclosure provides a manufacturing apparatus of an OLED display panel, with sub-pixels on the substrate printed and formed by the roller rotating to follow the movement of the substrate. The surface of the roller may be provided with liquid outlets disposed in an arrangement the same with the arrangement of the sub-pixels on the substrate in at least one cycle. The liquid outlet may be configured to form sub-pixels, and the RGB trichromatic sub-pixels can be printed and formed at one step. The present disclosure can improve the utilization of the organic light-emitting coating forming the sub-pixels, simplify the production process and cycle, and increase the production efficiency.

The above description merely illustrates some exemplary embodiments of the disclosure, which however are not intended to limit the scope of the disclosure to these specific embodiments. Any equivalent structural or flow modifications or transformations made to the disclosure, or any direct or indirect applications of the disclosure on any other related fields, shall all fall in the scope of the disclosure.

What is claimed is:

1. A manufacturing method of an OLED panel, comprising:
    providing a substrate;
    providing a roller with a plurality of RGB liquid outlets, the RGB liquid outlets capable of spraying RGB organic light-emitting coating liquid, wherein the substrate is in contact with the roller; and
    rotating the roller relative to the substrate such that the organic light-emitting coating is sprayed onto the substrate to form a plurality of RGB trichromatic sub-pixels disposed in sequence on the substrate;
    wherein the substrate comprises two opposite sides aligned with two lateral surfaces of the roller.

2. The manufacturing method of claim 1, wherein the substrate is capable of moving, when the substrate moves, the roller rotates along a moving direction of the substrate such that the RGB trichromatic sub-pixels are formed in a letterpress printing manner.

3. The manufacturing method of claim 1, wherein the substrate is fixed under the roller.

4. The manufacturing method of claim 1, wherein the liquid outlets protrude from a plane of the roller; when the roller rotates, the liquid outlets are in contact with the substrate.

5. The manufacturing method of claim 1, further comprising:
    determining a viscosity change curve of the organic light-emitting coating corresponding to the RGB trichromatic sub-pixels of the substrate; and
    determining a flow of the plurality of RGB liquid outlets to form the plurality of RGB trichromatic sub-pixels disposed in sequence, according to a pixel size of the RGB trichromatic sub-pixels and the viscosity change curve.

6. The manufacturing method of claim 5, wherein the determining the flow of the plurality of RGB liquid outlets to form the plurality of RGB trichromatic sub-pixels disposed in sequence, according to the pixel size of the RGB trichromatic sub-pixels and the viscosity change curve comprises:

determining a flow of the plurality of RGB liquid outlets to from a plurality of RGB trichromatic sub-pixels disposed in sequence by a flow meter, according to the pixel size of the RGB trichromatic sub-pixels and the viscosity change curve.

7. The manufacturing method of claim 6, wherein the determining the flow of the plurality of RGB liquid outlets to form the plurality of RGB trichromatic sub-pixels disposed in sequence by the flow meter, according to the pixel size of the RGB trichromatic sub-pixels and the viscosity change curve comprises:

determining a pressure of a pressure-limiting valve corresponding to a plurality of RGB liquid outlets by a flow meter, according to the pixel size of the RGB trichromatic sub-pixels and the viscosity change curve, so as to control a flow of a plurality of RGB liquid outlets to from a plurality of RGB trichromatic sub-pixels disposed in sequence.

8. An OLED panel manufacturing apparatus, comprising:

at least one roller;

at least one outlet used to print a plurality of RGB trichromatic sub-pixels disposed in sequence on a substrate by spraying organic light-emitting coating; wherein each of the outlet have a plurality of RGB liquid outlets, which are disposed on the outer wall of the roller; and at least one pipe used to convey the organic light-emitting coating; wherein each of the pipes is connecting to the RGB liquid outlet spraying organic light-emitting coating with the same color;

wherein two lateral surfaces of the roller are separately aligned with two opposite sides of the substrate.

9. The OLED panel manufacturing apparatus of claim 8, wherein the roller is fixed above the substrate.

10. The OLED panel manufacturing apparatus of claim 9, wherein the substrate is capable of moving, when the substrate moves, the roller rotates along a moving direction of the substrate such that the RGB trichromatic sub-pixels are formed in a letterpress printing manner.

11. The OLED panel manufacturing apparatus of claim 8, wherein the pipes comprise a plurality of secondary pipes connecting the RGB liquid outlets, one end of which is arc structure such that the RGB liquid outlets connecting to the secondary pipes can spray the organic light-emitting coating on the substrate simultaneously.

12. The OLED panel manufacturing apparatus of claim 8, further comprising:

a flow meter, disposed in a pipe conveying the organic light-emitting coating towards a corresponding liquid outlet and used to obtain a flow of the pipe;

a pressure-limiting valve, disposed in a pipe conveying the organic light-emitting coating towards a corresponding liquid outlet used to adjust a pressure of the pipe;

and a controller, connecting with the flow meter and the pressure-limiting valve separately.

13. The OLED panel manufacturing apparatus of claim 12, wherein the controller is used to control a corresponding pressure of the pressure-limiting valve and a spray amount of the organic light-emitting coating outlet.

* * * * *